US010795430B1

(12) United States Patent
Arsovski et al.

(10) Patent No.: US 10,795,430 B1
(45) Date of Patent: Oct. 6, 2020

(54) ACTIVITY-AWARE SUPPLY VOLTAGE AND BIAS VOLTAGE COMPENSATION

(71) Applicant: GLOBALFOUNDRIES Inc., Grand Cayman (KY)

(72) Inventors: Igor Arsovski, Williston, VT (US); Kushal Kamal, Bangalore (IN)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/421,730

(22) Filed: May 24, 2019

(51) Int. Cl.
  *G06F 1/3296* (2019.01)
  *G06F 30/00* (2020.01)
  *G05F 3/20* (2006.01)

(52) U.S. Cl.
  CPC .......... *G06F 1/3296* (2013.01); *G05F 3/205* (2013.01); *G06F 30/00* (2020.01)

(58) Field of Classification Search
  CPC ........ G06F 1/3296; G06F 30/00; G05F 3/205
  See application file for complete search history.

(56) References Cited

U.S. PATENT DOCUMENTS

| 4,039,928 A * | 8/1977 | Noftsker | H02M 7/1557 323/326 |
| 6,731,158 B1 | 5/2004 | Hass | |
| 7,009,904 B2 | 3/2006 | Kim | |
| 7,334,198 B2 | 2/2008 | Ditzel et al. | |
| 8,319,515 B2 * | 11/2012 | Masleid | H03K 19/0027 324/762.01 |
| 8,458,501 B2 * | 6/2013 | Bose | G06F 1/3206 713/320 |
| 8,697,512 B2 * | 4/2014 | Koniaris | H03K 19/0027 438/199 |
| 8,705,300 B1 * | 4/2014 | Xu | G11O 5/147 365/154 |
| 8,839,006 B2 * | 9/2014 | Li | G06F 1/3228 713/300 |
| 9,100,003 B2 * | 8/2015 | Masleid | H03K 19/0027 |
| 9,134,782 B2 * | 9/2015 | Reddy | G06F 1/3203 |
| 10,432,174 B2 * | 10/2019 | Koniaris | G05B 13/021 |
| 2011/0291746 A1 * | 12/2011 | Ibrahim | G06F 1/3206 327/538 |
| 2015/0177796 A1 * | 6/2015 | Bose | G06F 1/26 713/300 |

OTHER PUBLICATIONS

Mehta, Nandish, et al., "Dynamic Supply and Threshold Voltage Scaling for CMOS digital Circuits Using In-situ power monitor", May 2012, IEEE, IEEE Transactions on Very LArge Scale Integration (VLSI) systems, vol. 20, No. 5, pp. 892-901. (Year: 2012).*

* cited by examiner

*Primary Examiner* — Stacy Whitmore
(74) *Attorney, Agent, or Firm* — Amerson Law Firm, PLLC

(57) ABSTRACT

A semiconductor device is disclosed that includes, among other things, a computing device including a plurality of transistors, an activity monitor to determine an activity metric associated with the plurality of transistors, and a power controller to, responsive to the activity metric indicating a first activity level, set a power supply voltage for the plurality of transistors to a first value, and responsive to the activity metric indicating a second activity level less than the first activity level, set the power supply voltage to a second value greater than the first value and apply a first reverse back bias voltage to the plurality of transistors to increase a threshold voltage of the plurality of transistors.

17 Claims, 3 Drawing Sheets

| ACTIVITY FACTOR | $V_{DD}$ | $V_{BB}$ | $V_{BIASN}$ | $V_{BIASP}$ |
|---|---|---|---|---|
| 5 (NOMINAL) | $V_{DDN}$ | 0 | $V_{SS}$ | $V_{DDN}$ |
| 4 (LOW1) | $V_{DDN} + 0.1$ | $V_{DDN}$ (RBB) | $-V_{DDN}$ | $2*V_{DDN}$ |
| 3 (LOW2) | $V_{DDN} + 0.2$ | $2*V_{DDN}$ (RBB) | $-2*V_{DDN}$ | $3*V_{DDN}$ |
| 6 (HIGH1) | $V_{DDN} - 0.1$ | $V_{DDN}$ (FBB) | $V_{DDN}$ | $V_{SS}$ |
| 7 (HIGH2) | $V_{DDN} - 0.2$ | $2*V_{DDN}$ (FBB) | $2*V_{DDN}$ | $V_{SS} - V_{DDN}$ |

ACTIVITY-AWARE SUPPLY VOLTAGE AND BIAS VOLTAGE COMPENSATION

BACKGROUND

Field of the Disclosure

Generally, the present disclosure relates to semiconductor devices and, in particular, to a computing device implementing activity-aware supply voltage and bias voltage compensation.

Description of the Related Art

Many computing devices, such as smartphones, tablets, laptops, smart watches, etc., employ batteries as a primary power source. To extend the battery life of a device, power management techniques have been employed to change the operating characteristics of the device during periods of low activity to save power. For example, power consumption may be reduced by reducing parameters of the device, such as the supply voltage, $V_{DD}$, or the operating frequency tends to change the performance of the device, where reduced performance is a trade-off for power consumption. In some situations, even though the activity level of the device may be low, the reduced performance is noticeable by the user.

The present disclosure is directed to various methods and resulting devices that may avoid, or at least reduce, the effects of one or more of the problems identified above.

SUMMARY

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative embodiment disclosed herein relates to a semiconductor device. The semiconductor device includes, among other things, a computing device including a plurality of transistors, an activity monitor to determine an activity metric associated with the plurality of transistors, and a power controller to, responsive to the activity metric indicating a first activity level, set a power supply voltage for the plurality of transistors to a first value, and responsive to the activity metric indicating a second activity level less than the first activity level, set the power supply voltage to a second value greater than the first value and apply a first reverse back bias voltage to the plurality of transistors to increase a threshold voltage of the plurality of transistors.

Another illustrative semiconductor device includes, among other things, a computing device including a plurality of transistors, a voltage regulator to generate a power supply voltage and a reference supply voltage for the plurality of transistors, a bias voltage generator to generate a first bias voltage for a set of N-type transistors in the plurality of transistors and to generate a second bias voltage for a set of P-type transistors in the plurality of transistors, an activity monitor to determine an activity metric associated with the plurality of transistors, and a power controller to, responsive to the activity metric indicating a first activity level, configure the voltage regulator to set the power supply voltage to a first value, and responsive to the activity metric indicating a second activity level less than the first activity level, configure the voltage regulator to set the power supply voltage to a second value greater than the first value and configure the bias voltage generator to set the first bias voltage and the second bias voltage to increase a threshold voltage of the plurality of transistors.

One illustrative method includes, among other things, determining an activity metric of a computing device including a plurality of transistors, responsive to the activity metric indicating a first activity level, setting a power supply voltage for the plurality of transistors to a first value, and responsive to the activity metric indicating a second activity level less than the first activity level, setting the power supply voltage to a second value greater than the first value and applying a first reverse back bias voltage to the plurality of transistors to increase a threshold voltage of the plurality of transistors.

BRIEF DESCRIPTION OF THE DRAWINGS

The disclosure may be understood by reference to the following description taken in conjunction with the accompanying drawings, in which like reference numerals identify like elements, and in which:

FIG. 4 is a diagram of a look-up table containing supply voltage and bias voltage settings for the computing device of FIG. 1, in accordance with some embodiments.

Figure 1:
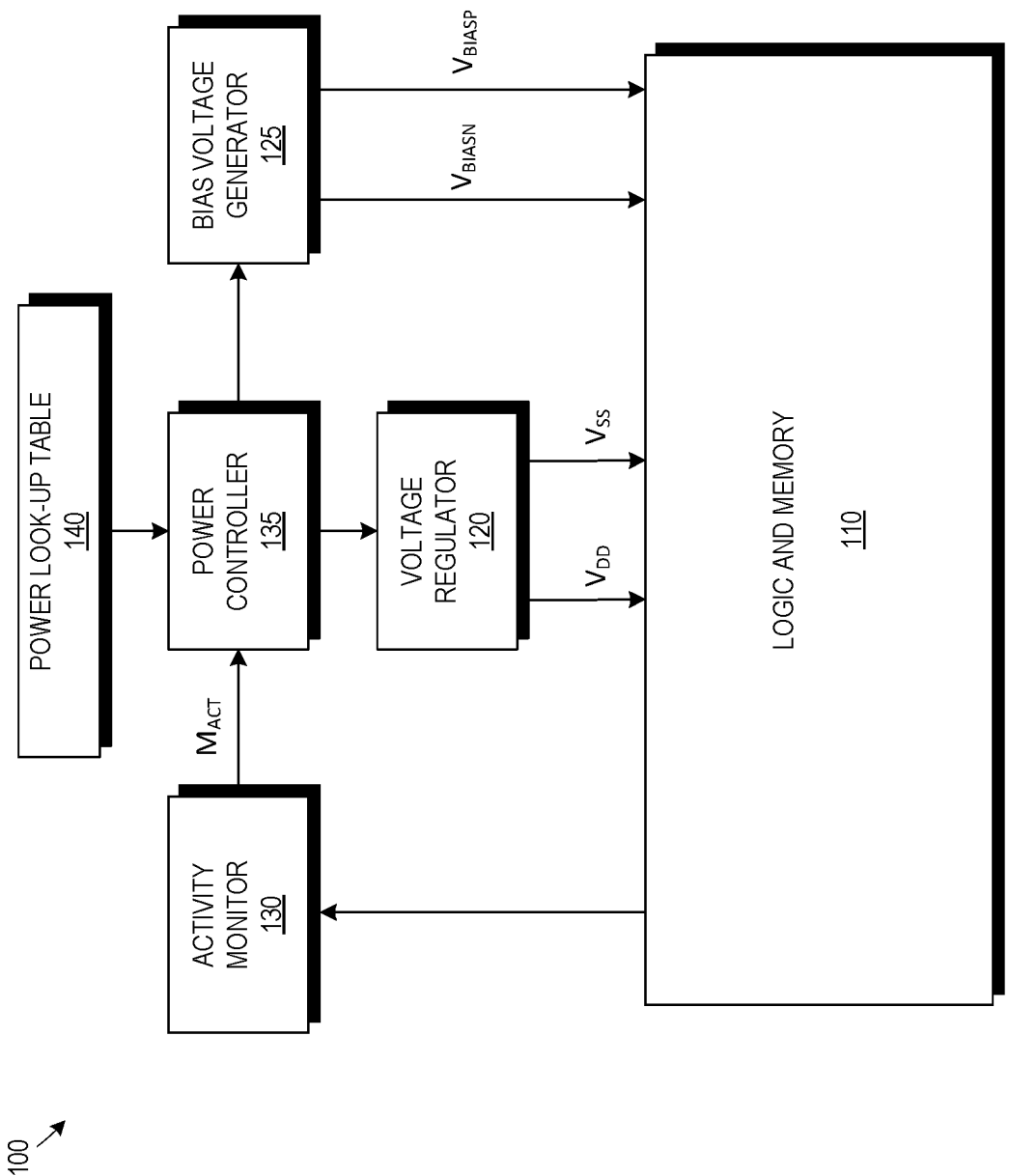
FIG. 1 is a block diagram of a computing device implementing activity-aware supply voltage and bias voltage compensation, in accordance with some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 is a block diagram of a computing device 100 implementing activity-aware supply voltage and bias voltage compensation, in accordance with some embodiments. The computing device 100 includes a logic and memory block 110 representing the transistor devices in the computing device. The transistor devices may be used to implement a processor, a system memory, a cache memory, various buffers, logic devices, etc. A voltage regulator 120 generates a positive supply voltage, $V_{DD}$, and a reference supply voltage, $V_{SS}$, for the logic and memory block 110, and a bias voltage generator 125 generate bias voltages, $V_{BIASN}$, $V_{BIASP}$, for biasing transistors in the logic and memory block 110. An activity monitor 130 generates an activity metric, $M_{ACT}$, indicating the activity level of the logic and memory block 110. For example, the activity monitor 130 may measure the transactions on one or more processors, buses, logic units, etc. in the logic and memory block 110 to generate the activity metric. In some embodiments, the activity metric represents a percentage that indicates the number of times the average net has toggled in a time period in which the fastest clock net has toggled 100 times. The construct and operation of activity monitors is known in the art, so they are not described in detail herein to avoid obscuring the present subject matter. The activity monitor 130 provides the activity metric to a power controller 135. The power controller 135 provides control inputs to the voltage regulator 120 and the bias voltage generator 125 to control the levels of the supply voltages, $V_{DD}$, $V_{SS}$, and the bias voltages, $V_{BIASN}$, $V_{BIASP}$. Although illustrated as separate entities, the voltage regulator 120 and the bias voltage generator 125 may be integrated into the power controller 135. The power controller 135 changes the voltage values based on the value of the activity metric to reduce power consumption without sacrificing performance. In some embodiments, the power controller 135 employs a power look-up table 140 that stores supply and bias voltage parameters as a function of activity level. Although the activity monitor 130, the power controller 135, and the power look-up table 140 are illustrated as separate entities, they may be implemented using circuitry within the logic and memory block 110.

Figure 2:
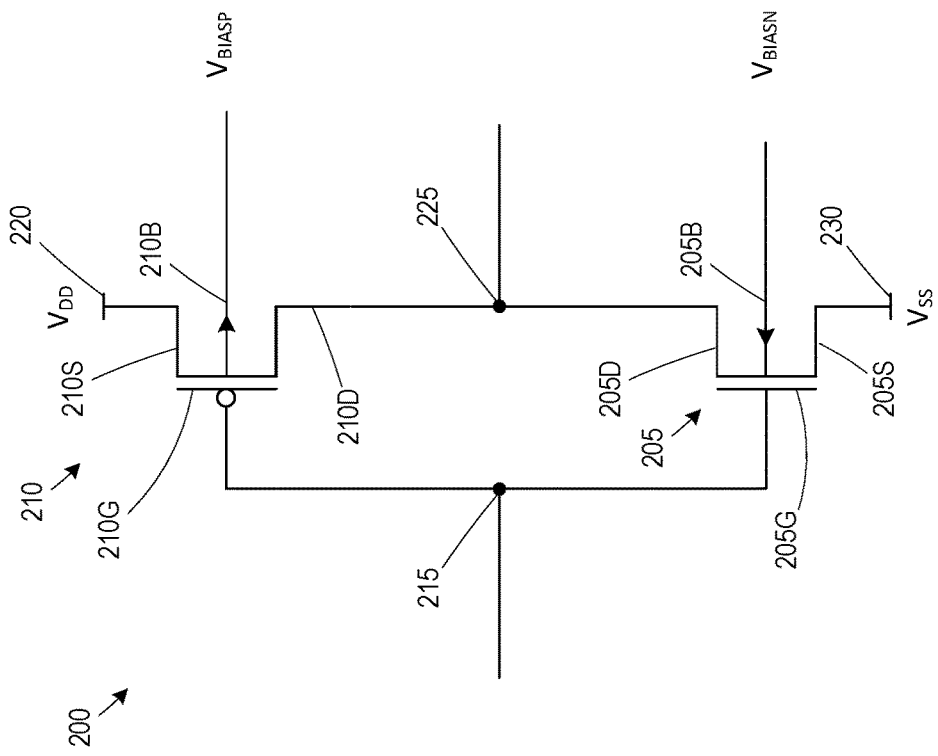
FIG. 2 is a circuit diagram of an example complementary-metal-oxide-semiconductor (CMOS) circuit in the computing device of FIG. 1, in accordance with some embodiments.

FIG. 2 is a circuit diagram of an example complementary-metal-oxide-semiconductor (CMOS) device 200 that may be included in the logic and memory block 110 in the computing device 100 of FIG. 1, in accordance with some embodiments. Not all of the transistor devices in the logic and memory block 110 need to be in a CMOS arrangement. Example elements that may be in a CMOS arrangement include static random access memory (SRAM) arrays, inverters, logic gates, latches, etc. The CMOS device 200 includes an NMOS transistor 205 and a PMOS transistor 210. An input node 215 is connected to a gate 205G of the NMOS transistor 205 and a gate 210G of the PMOS transistor 210. A source 210S of the PMOS transistor 210 is connected to a first supply voltage 220 (e.g., $V_{DD}$). An output node 225 of the CMOS device 200 is connected to a drain 205D of the NMOS transistor 205 and a drain 210D of the PMOS transistor 210. A source 205S of the NMOS transistor 205 is connected to a second supply voltage (e.g., $V_{SS}$). A first bias voltage, $V_{BIASN}$, is applied to a body 205B of the NMOS transistor 205, and a second bias voltage, $V_{BIASP}$, is applied to a body 210B of the PMOS transistor 210.

In general, the power consumption of the computing device 100 includes a dynamic power component and a leakage power component. Leakage power is dependent on many factors, one of the most dominant being threshold voltage. Leakage power varies exponentially with threshold voltage. Dynamic power is dependent on various factors, one of the most dominant being $V_{DD}$. Dynamic power is directly proportional to the square of the supply voltage. Reducing the threshold voltage reduces the switching time of the transistor, but increases leakage power exponentially. Raising the threshold voltage increases switching time, but reduces leakage power exponentially. Increasing the supply voltage reduces the switching time of the transistor, but increases leakage power linearly and dynamic power as the square of $V_{DD}$. Decreasing the supply voltage increases the switching time of the transistor, but decreases leakage power linearly and dynamic power as the square of $V_{DD}$. The primary contributor to dynamic power, and, hence, the total power consumption, depends on the activity level. During periods of high activity, the dynamic power component is the primary contributor to total power consumption. During periods of low activity, leakage power is the primary contributor to total power consumption. The power controller 135 employs this relationship to control the voltage regulator 120 and the bias voltage generator 125 based on input from the activity monitor 130.

The power controller 135 sets the magnitudes of the supply voltages, $V_{DD}$, $V_{SS}$ and the bias voltages, $V_{BIASN}$, $V_{BIASP}$ to control and vary the threshold voltages of the NMOS transistors and PMOS transistors in the logic and memory block 110 (e.g., as represented by the NMOS transistor 205 and the PMOS transistor 210 in FIG. 2).

Figure 3:
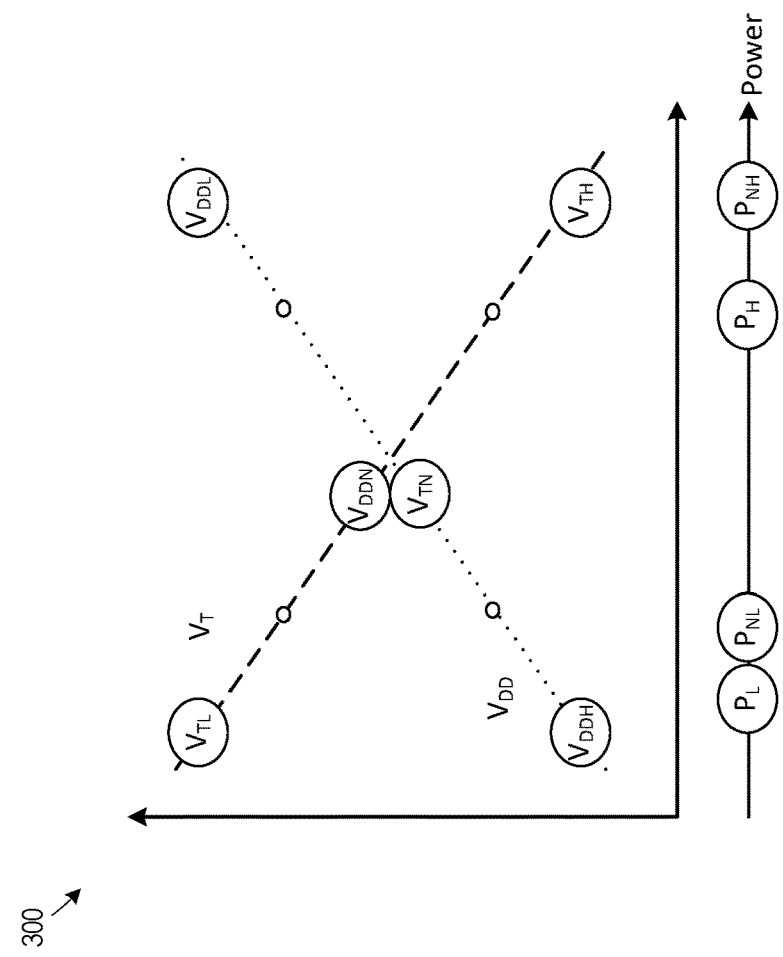
FIG. 3 is a diagram illustrating various operating points for supply voltage, $V_{DD}$, and threshold voltage, $V_T$, in accordance with some embodiments.

FIG. 3 is a diagram 300 illustrating various operating points for supply voltage, $V_{DD}$, and threshold voltage, $V_T$, in accordance with some embodiments. The various operating points are selected as a function of the activity level determined by the activity monitor 130. A nominal activity level is selected for the computing device 100. A nominal supply voltage, $V_{DDN}$, is selected by the power controller 135 and no back bias is applied (e.g., $V_{BIASN}=V_{SS}$, and $V_{BIASP}=V_{DDN}$), resulting in a nominal threshold voltage, $V_{TN}$. If the supply voltage and back bias voltages were kept at the nominal values, during a period of high activity the power consumption of the computing device 100 would be $P_{NH}$, and during a period of low activity the power consumption of the computing device 100 would be $P_{NL}$.

The power controller 130 adjusts the supply voltage and the back bias voltages during periods of low and high activity relative to the nominal activity level in a manner that maintains the performance of the computing device 100 (e.g., in terms of clock frequency), but reduces power consumption. During periods of low activity relative to the nominal activity level, the power controller 130 increases the supply voltage to $V_{DDL}$ and applies a reverse back bias voltage to increase the threshold voltage to $V_{TL}$, such that the difference between $V_{DDL}$ and $V_{TL}$ remains the same as the difference between $V_{DDN}$ and $V_{TN}$ under nominal conditions. This configuration reduces the dominant part of total power, which is leakage power, resulting in the power consumption $P_L$ being less than the nominal low activity power consumption $P_{NL}$. During periods of high activity relative to the nominal activity level, the power controller 130 decreases the supply voltage to $V_{DDH}$ and applies a forward back bias voltage to decrease the threshold voltage to $V_{TH}$, such that the difference between $V_{DDH}$ and $V_{TH}$ remains the same as the difference between $V_{DDN}$ and $V_{TN}$ under nominal conditions. This configuration reduces the dominant part of total power, which is dynamic power, resulting in the power consumption $P_H$ being less than the nominal high activity power consumption $P_{NH}$. Multiple sets of the operating parameters may be provided in the low activity region and the high activity region, as represented by the open circles along the $V_{DD}$ and $V_T$ lines. The operating parameters $V_{DDH}$ and $V_{TH}$ represent a maximum activity level used by the power controller 130, and the operating parameters $V_{DDL}$ and $V_{TL}$ represent a minimum activity level used by the power controller 130. Multiple sets of the operating parameters may be provided in the low activity region and the high activity region, as shown by the open circles along the $V_{DD}$ and $V_T$ lines, to accommodate activity levels between the maximum and the minimum relative to the nominal activity level.

FIG. 4 is a diagram of the power look-up table 140 containing supply voltage and bias voltage settings for the computing device 100 as a function of activity level, in accordance with some embodiments. Table 4 illustrates a nominal activity level, two low activity levels, and two high activity levels. The number of activity levels may change depending on the degree of granularity provided by the activity monitor 130 and the power controller 135. For low activity levels, the $V_{DD}$, $V_{BIASN}$, and $V_{BIASP}$ settings result in a reverse bias condition, and for high activity levels, the $V_{DD}$, $V_{BIASN}$, and $V_{BIASP}$ settings result in a forward bias condition. Particular values for the $V_{DD}$, $V_{BIASN}$, and $V_{BIASP}$ settings may be determined by simulating the operation of the computing device 100 at different operating points to determine the settings that reduce power without reducing performance.

Controlling the values for the $V_{DD}$, $V_{BIASN}$, and $V_{BIASP}$ settings as a function of activity level has numerous advantages. Power consumption in low activity periods may be reduced by increasing supply voltage and threshold voltage to reduce leakage power without reducing performance. Power consumption in high activity periods may be reduced by decreasing supply voltage and threshold voltage to reduce dynamic power without reducing performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A computing device, comprising:
   a plurality of transistors, wherein the plurality of transistors comprises a first set of N-type transistors and a second set of P-type transistors;
   an activity monitor to determine an activity metric associated with the plurality of transistors; and
   a power controller to, responsive to the activity metric indicating a first activity level, set a power supply voltage for the plurality of transistors to a first value, and responsive to the activity metric indicating a second activity level less than the first activity level, set the power supply voltage to a second value greater than the first value and apply a first reverse back bias voltage to the plurality of transistors to increase a threshold voltage of the plurality of transistors and wherein the power controller is to set a first back bias voltage having a negative value for the first set of N-type transistors and set a second back bias voltage having a positive value for the second set of P-type transistors.

2. The computing device of claim 1, wherein the power controller employs a look-up table storing power supply voltage parameters and back bias voltage parameters as a function of activity levels to set the power supply voltage and the first reverse back bias voltage.

3. The computing device of claim 1, wherein the power controller is to, responsive to the activity metric indicating a third activity level less than the second activity level, set the power supply voltage to a third value greater than the second value and apply a second forward back bias voltage greater than the first forward back bias voltage to the plurality of transistors.

4. The computing device of claim 1, wherein the power controller is to, responsive to the activity metric indicating a third activity level greater than the first activity level, set the power supply voltage to a third value less than the first value and apply a first forward back bias voltage to the plurality of transistors.

5. The computing device of claim 4, wherein the applied forward back bias voltage results in a decrease in a threshold voltage of the plurality of transistors.

6. The computing device of claim 4, wherein the plurality of transistors comprises a first set of N-type transistors and a second set of P-type transistors, and the power controller is to set a first back bias voltage having a positive value for the first set of N-type transistors and set a second back bias voltage having a value less than or equal to a reference supply voltage for the second set of P-type transistors.

7. The computing device of claim 4, wherein the power controller is to, responsive to the activity metric indicating a fourth activity level greater than the third activity level, set the power supply voltage to a fourth value less than the third value and apply a second forward back bias voltage greater than the first forward back bias voltage to the plurality of transistors.

8. A computing device, comprising:
   a plurality of transistors;
   a voltage regulator to generate a power supply voltage and a reference supply voltage for the plurality of transistors;
   a bias voltage generator to generate a first bias voltage for a set of N-type transistors in the plurality of transistors and to generate a second bias voltage for a set of P-type transistors in the plurality of transistors;

an activity monitor to determine an activity metric associated with the plurality of transistors; and a power controller to, responsive to the activity metric indicating a first activity level, configure the voltage regulator to set the power supply voltage to a first value, and responsive to the activity metric indicating a second activity level less than the first activity level, configure the voltage regulator to set the power supply voltage to a second value greater than the first value and configure the bias voltage generator to set the first bias voltage and the second bias voltage to increase a threshold voltage of the plurality of transistors, wherein the power controller is to, responsive to the activity metric indicating a third activity level greater than the first activity level, configure the voltage regulator to set the power supply voltage to a third value less than the first value and configure the bias voltage generator to decrease the threshold voltage for the plurality of transistors.

9. The computing device of claim 8, wherein the power controller employs a look-up table storing power supply voltage parameters and back bias voltage parameters as a function of activity levels to configure the voltage regulator and the bias voltage generator.

10. The computing device of claim 8, wherein the power controller is to, responsive to the activity metric indicating a fourth activity level less than the second activity level, configure the voltage regulator to set the power supply voltage to a third value greater than the second value and configure the bias voltage generator to further increase the threshold voltage of the plurality of transistors.

11. The computing device of claim 8, wherein the power controller is to configure the bias voltage generator to generate a reverse back bias condition for the plurality of transistors to increase the threshold voltage and to generate a forward back bias condition for the plurality of transistors to decrease the threshold voltage.

12. A method, comprising:
determining an activity metric of a computing device comprising a plurality of transistors, wherein the plurality of transistors comprises a first set of N-type transistors and a second set of P-type transistors;

responsive to the activity metric indicating a first activity level, setting a power supply voltage for the plurality of transistors to a first value; and responsive to the activity metric indicating a second activity level less than the first activity level, setting the power supply voltage to a second value greater than the first value and applying a first back bias voltage having a negative value to the first set of N-type transistors and applying a second back bias voltage having a positive value to the second set of P-type transistors to increase a threshold voltage of the plurality of transistors.

13. The method of claim 12, further comprising, responsive to the activity metric indicating a third activity level less than the second activity level, setting the power supply voltage to a third value greater than the second value and applying a second forward back bias voltage greater than the first forward back bias voltage to the plurality of transistors.

14. The method of claim 12, further comprising, responsive to the activity metric indicating a third activity level greater than the first activity level, setting the power supply voltage to a third value less than the first value and applying a first forward back bias voltage to the plurality of transistors.

15. The method of claim 14, wherein the applied forward back bias voltage results in a decrease in a threshold voltage of the plurality of transistors.

16. The method of claim 14, wherein the plurality of transistors comprises a first set of N-type transistors and a second set of P-type transistors, and the method further comprises:
applying a first back bias voltage having a positive value to the first set of N-type transistors; and
applying a second back bias voltage having a value less than or equal to a reference supply voltage to the second set of P-type transistors.

17. The method of claim 14, further comprising, responsive to the activity metric indicating a fourth activity level greater than the third activity level, setting the power supply voltage to a fourth value less than the third value and applying a second forward back bias voltage greater than the first forward back bias voltage to the plurality of transistors.

* * * * *